US007889562B2

(12) United States Patent
Nobunaga

(10) Patent No.: US 7,889,562 B2
(45) Date of Patent: Feb. 15, 2011

(54) ADJUSTING PROGRAMMING OR ERASE VOLTAGE PULSES IN RESPONSE TO A RATE OF PROGRAMMING OR ERASING

(75) Inventor: Dean Nobunaga, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/614,626

(22) Filed: Nov. 9, 2009

(65) Prior Publication Data

US 2010/0054041 A1   Mar. 4, 2010

Related U.S. Application Data

(63) Continuation of application No. 12/052,228, filed on Mar. 20, 2008, now Pat. No. 7,633,804.

(51) Int. Cl.
*G11C 16/04* (2006.01)
(52) U.S. Cl. ............................. 365/185.19; 365/185.18; 365/185.29
(58) Field of Classification Search ............ 365/185.18, 365/185.19, 185.21, 185.22, 185.23, 185.29, 365/233.5, 236
See application file for complete search history.

(56) References Cited

U.S. PATENT DOCUMENTS

| 5,453,737 | A | 9/1995 | Opoczynski | |
|---|---|---|---|---|
| 6,278,633 | B1 * | 8/2001 | Wong et al. | 365/185.03 |
| 7,239,557 | B2 | 7/2007 | Ha | |
| 7,304,893 | B1 * | 12/2007 | Hemink | 365/185.22 |
| 7,355,892 | B2 * | 4/2008 | Hemink | 365/185.22 |
| 7,564,718 | B2 | 7/2009 | Seidel et al. | |
| 7,633,804 | B2 * | 12/2009 | Nobunaga | 365/185.19 |
| 7,656,710 | B1 * | 2/2010 | Wong | 365/185.19 |
| 2008/0002468 | A1 * | 1/2008 | Hemink | 365/185.17 |
| 2009/0073772 | A1 | 3/2009 | Ha | |

OTHER PUBLICATIONS

K. Suh, et al. "A 3.3. V 32 Mb NAND Flash Memory with Incremetnal Step Pulse Programming Scheme" IEEE Journal of Solid-State Circuits, vol. 30, No. 11, Nov. 1995 pp. 1149-1156.

* cited by examiner

*Primary Examiner*—Gene N. Auduong
(74) *Attorney, Agent, or Firm*—Leffert Jay & Polglaze, P.A.

(57) ABSTRACT

Memory devices and methods of operating memory devices are provided. In one such embodiment, a programming voltage pulse or an erase voltage pulse is applied to memory cells of a memory device. A rate at which programming or erasing is proceeding is determined. The programming voltage pulse or the erase voltage pulse is adjusted at least partially in response to the determined rate. The adjusted programming voltage pulse or the adjusted erase voltage pulse is applied to the memory cells that failed to program or erase.

23 Claims, 4 Drawing Sheets ated pages...

ADJUSTING PROGRAMMING OR ERASE VOLTAGE PULSES IN RESPONSE TO A RATE OF PROGRAMMING OR ERASING

RELATED APPLICATION

This application is a continuation of U.S. application Ser. No. 12/052,228, titled "ADJUSTING PROGRAMMING OR ERASE VOLTAGE PULSES IN RESPONSE TO THE NUMBER OF PROGRAMMING OR ERASE FAILURES," filed Mar. 20, 2008 now U.S. Pat. No. 7,633,804, (allowed) which is commonly assigned and incorporated herein by reference.

FIELD

The present disclosure relates generally to programming and erasing memory devices and, in particular, the present disclosure relates to adjusting programming or erase voltage pulses in response to a rate of programming or erasing.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage nodes, such as trapping layers or other physical phenomena (which is sometimes referred to as writing), determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a data line, such as column bit line.

The memory array is accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the column bit line to the source line through each NAND string via the corresponding select gates, restricted only by the selected memory cells of each string. This places the current-encoded data values of the row of selected memory cells on the column bit lines.

For some applications, flash memory stores a single bit per cell. Each cell is characterized by a specific threshold voltage, which is sometimes referred to as the Vt level. Within each cell, two or more possible Vt levels exist. These Vt levels are controlled by the amount of charge that is programmed or stored on the floating gate. For some NAND architectures, for example, a memory cell might have a Vt level (e.g., program Vt) greater than zero in a programmed (e.g., logic zero) state and a Vt level (e.g., erase Vt) less than zero in an erase (e.g., logic one) state.

Memory cells are typically programmed using program/erase cycles, e.g., where the memory cells are first erased and subsequently programmed. For a NAND array, a block of memory cells is typically erased by grounding all of the word lines in the block and applying an erase voltage to a semiconductor substrate on which the memory cells are formed, and thus to the channels of the memory cells, to remove the charge from the floating gates. More specifically, the charge is removed through Fowler-Nordheim tunneling of electrons from the floating gate to the channel, resulting in an erase Vt typically less than zero.

Programming typically involves applying a programming voltage to one or more selected word lines and thus to the control gate of each memory cell coupled to the one or more selected word lines, regardless of whether a memory cell is targeted or untargeted for programming. While the programming voltage is applied to the one or more selected word lines, a potential, such as a ground potential, is applied to the substrate, and thus to the channels of these memory cells, to charge the floating gates. More specifically, the floating gates are typically charged through direct injection or Fowler-Nordheim tunneling of electrons from the channel to the floating gate, resulting in a program Vt typically greater than zero.

The mechanism for both programming and erasing results in the passage of electrons though a tunnel dielectric layer, e.g., a tunnel oxide layer, interposed between the substrate and the floating gates of the memory cells, and therefore, electrons can become trapped in the oxide layer. As the number of program/erase cycles increases, an increasing number of electrons become trapped in the oxide layer. The trapped electrons act to increase the charge on the floating gates and thus the program Vt and the erase Vt of the memory cells. Therefore, the program Vt and the erase Vt increase as the number of program/erase cycles increases. As the program Vt and the erase Vt increase with the number of program/erase cycles, the erase voltage applied to the substrate for erasing the memory cells needs to increase to properly erase all the memory cells, and the programming voltage applied to the word lines needs to decrease to avoid over programming the memory cells.

The programming operation typically involves applying, to selected word lines, a number of programming pulses that start at a predetermined starting voltage level, typically insufficient to program all of the targeted memory cells of the selected word lines, and that are incremented until all of the targeted memory cells of the selected word lines are programmed. If the predetermined starting voltage provides for efficient programming when the memory device is new, it may lead to over-programming of some memory cells whose program Vt has increased too much through multiple program/erase cycles. However, if a predetermined starting voltage is chosen to avoid over-programming of memory cells later in the device life-cycle, it will generally lead to inefficient programming when the device is new as an excessive amount of program pulses will be required to program the memory cells.

One or more selected memory cells are typically erased by applying one or more erase pulses having the same or differing (e.g., successively incremented) voltage levels to the substrate while the word line(s) coupled to the one or more selected memory cells are grounded. However, as the number of program/erase cycles increases, it becomes more difficult to erase the memory cells in that the erase threshold voltage increases as the number of program/erase cycles increases, and eventually the memory may not erase. If the erase voltage provides for efficient erase operations when the memory device is new, it will generally lead to inefficient erase operations later in the device life-cycle, as an excessive amount of erase pulses will be required to erase the memory cells whose erase Vt has increased too much through multiple program/erase cycles. However, if the erase voltage is chosen to avoid excessive erase pulses later in the device life-cycle, it may lead to over-erasure of memory cells when the device is new.

For the reasons stated above, and for other reasons stated below which will become apparent to those skilled in the art upon reading and understanding the present specification, there is a need in the art for alternative program and erase schemes.

DETAILED DESCRIPTION

Figure 1:
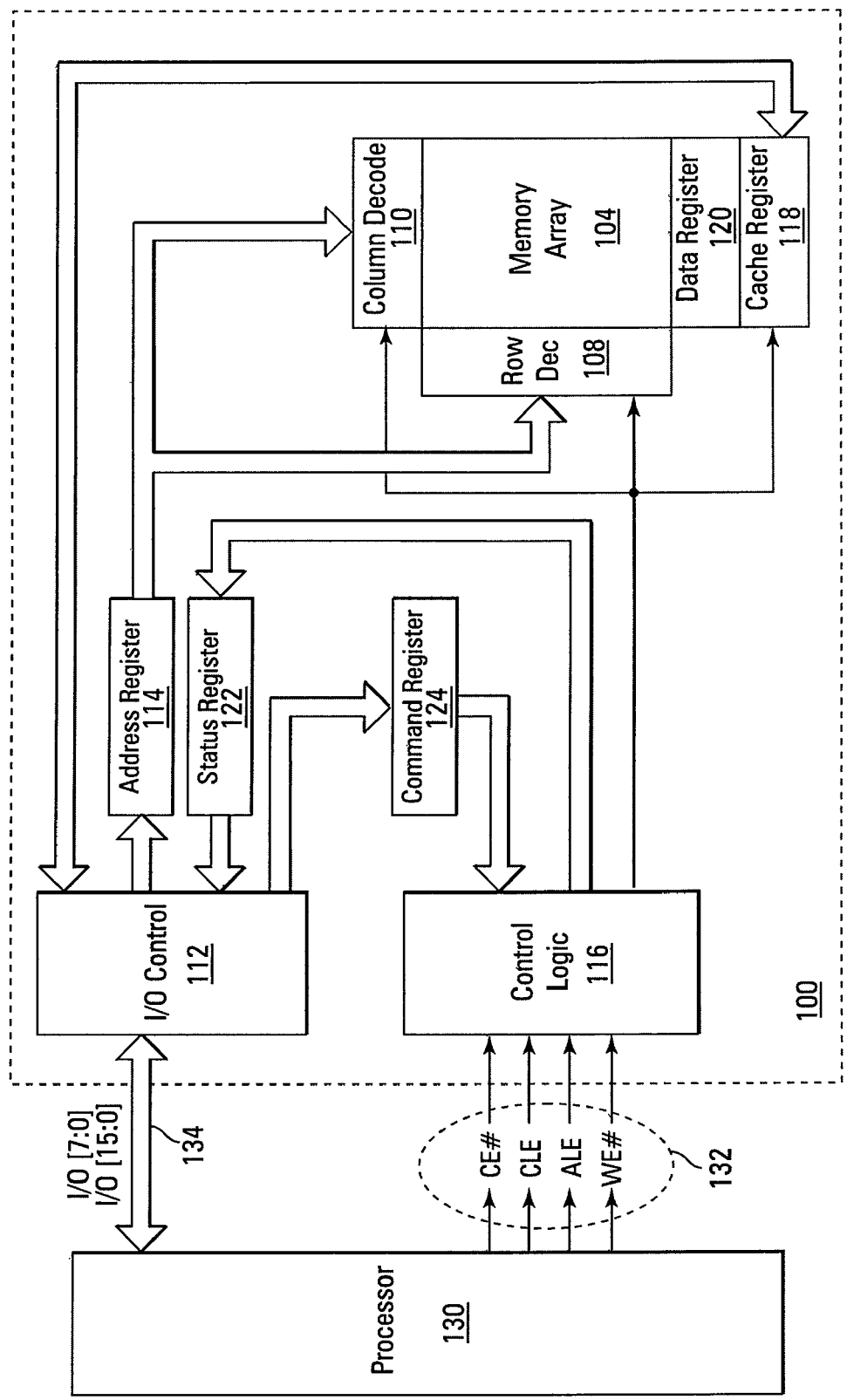
FIG. 1 is a simplified block diagram of an embodiment of a NAND flash memory device, according to an embodiment of the disclosure.

In the following detailed description, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present disclosure. The following detailed description is, therefore, not to be taken in a limiting sense, and the scope of the present disclosure is defined only by the appended claims and equivalents thereof.

FIG. 1 is a simplified block diagram of a NAND flash memory device 100 coupled to a processor 130 as part of an electronic system, according to an embodiment. The processor 130 may be a memory controller or other external host device. Memory device 100 includes an array of memory cells 104 arranged in rows and columns. A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is coupled between I/O control circuitry 112 and row decoder 108 and column decoder 110 to latch the address signals prior to decoding. A command register 124 is coupled between I/O control circuitry 112 and control logic 116 to latch incoming commands. Control logic 116 controls access to the memory array 104 in response to the commands and generates status information for the processor 130. The control logic 116 is coupled to row decoder 108 and column decoder 110 to control the row decoder 108 and column decoder 110 in response to the addresses.

Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which are sometimes referred to as commands), address signals (which are sometimes referred to as addresses), and data signals (which are sometimes referred to as data) from processor 130 over a multiplexed input/output (I/O) link 134 (which is sometimes referred to as an I/O bus) and outputs data to processor 130 over I/O link 134.

Specifically, the commands are received over input/output (I/O) pins [7:0] of I/O link 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device. It will be appreciated by those skilled in the art that additional circuitry and control signals can be provided, and that the memory device of FIG. 1 has been simplified to help focus on the invention. Additionally, while specific I/O pins are described in accordance with popular conventions for receipt and output of the various signals, it is noted that other combinations or numbers of I/O pins may be used in the various embodiments.

Control logic 116 is configured to program and/or erase the memory cells of memory array 104. For example, an erase operation is typically performed on a block of memory cells before they are programmed, and an erase operation followed by a programming operation constitutes a program/erase cycle.

For one embodiment, erasing starts by applying an erase voltage having an erase starting voltage level, e.g., to a substrate on which the memory cells of memory 104 are formed. If a subsequent erase verify indicates that each of the one or more target memory cells is erased, the erase is completed. Otherwise, the erase voltage is increased from the erase starting voltage level by an erase voltage step or the time duration over which the erase starting voltage level is applied is increased (i.e., the pulse width is increased). If a subsequent erase verify indicates that each of the one or more target memory cells is erased, the erase is completed. Otherwise, the erase voltage is again increased by the erase voltage step or the time duration over which the erase starting voltage level is applied is again increased followed by an erase verify. This is repeated until each of the one or more target memory cells is successfully erased, i.e., until the target memory cells are at least at their desired erase Vt.

After the erase operation is completed, the target memory cells are programmed. For one embodiment, programming starts by applying a programming voltage, having a program starting voltage level, to a selected word line coupled to the target memory cells. If a subsequent program verify indicates that each of the one or more target memory cells is programmed, programming is completed. Otherwise, the programming voltage is increased from the program starting voltage level by a program voltage step or the time duration over which the program starting voltage level is applied is increased. If a subsequent program verify indicates that each of the one or more target memory cells is programmed, programming is completed. Otherwise, the programming voltage is again increased by the program voltage step or the time duration over which the program starting voltage level is applied is again increased followed by a program verify. This is repeated until each of the one or more target memory cells is successfully programmed, i.e., until the target memory cells are at least at their desired program Vt. Subsequently, programming may proceed to other memory cells of the selected word line that correspond to another page, or programming may proceed to another word line of the same memory block or another memory block.

In accordance with one embodiment of the disclosure, control logic 116 is configured to determine a number of failed bits or bytes after each program and/or erase pulse during a program and/or erase verify. Control logic 116 is further configured to determine a rate at which the program and/or erase are proceeding by comparing the number of failed bits or bytes to certain (e.g., predetermined) reference values that are indicative of a certain (e.g., predetermined) rate at which the bits or bytes are being programmed or erased and that are or can be different than the number of cells to be programmed or erased during the current program or erase operation being performed. Control logic 116 is also configured to adjust a program or erase voltage step applied to the program or erase voltage pulse or to adjust the time duration over which the program and/or erase voltage pulse is applied in response, at least in part, to the rate at which the program and/or erase are proceeding.

Comparing the number of failed bits or bytes to certain (e.g., predetermined) reference values to determine the rate at which programming or erasing is proceeding, and adjusting a program or erase voltage step applied to the program or erase voltage pulse or adjusting the time duration over which the program and/or erase voltage pulse is applied in response to the comparison, avoids the necessity of determining the number of bits to be programmed during each programming operation, comparing the number of bits that have failed to the number of bits to be programmed, and adjusting the program voltage step based on comparing the number of bits that have failed to the number of bits to be programmed during that programming operation, as is done with some prior programming schemes. That is, for one embodiment, the adjustment of the program and/or erase voltage step applied to the program and/or erase voltage pulse, or the adjustment of the time duration over which the program and/or erase voltage pulse is applied, of the present disclosure is independent of the number of bits to be programmed or erased for that program or erase operation. For example, the certain reference values are or can be different than the number of bits to be programmed or erased for the respective program or erase operation.

Figure 2:
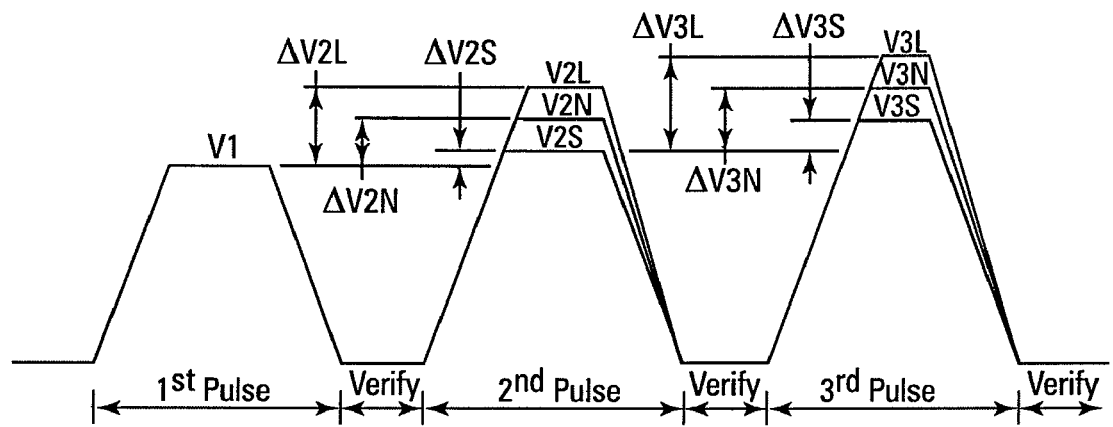
FIG. 2 is an example of adjusting a voltage step applied to a voltage pulse in response, at least in part, to the rate at which a program or erase is proceeding, according to another embodiment of the disclosure.

FIG. 2 is an example of adjusting a program and/or erase voltage step applied to the program and/or erase voltage pulse in response, at least in part, to the rate at which the program and/or erase are proceeding, according to an embodiment. In FIG. 2, the voltage V1 may be a starting voltage level of a first voltage pulse, e.g., a programming voltage pulse applied to a selected word line or an erase voltage pulse applied to a substrate on which memory cells are formed. After applying the first voltage pulse, a verify voltage is applied either to the selected word line as a program verify voltage or to all the word lines of the string simultaneously as an erase verify voltage (e.g., such an erase verify is sometimes referred to as a string verify). After applying the verify voltage, control logic 116 determines a number of cells (e.g., bits or bytes) that failed to program or that failed to erase (in some embodiments this is performed by determining a number of successfully programmed or erased memory cells) in response to applying the voltage V1. Note that for one embodiment, a number indicative of the number of memory cells that failed to program can be done either directly or indirectly, such as by determining a number of memory cells that were successfully programmed or erased.

For one embodiment, if the number of failed cells (e.g., that failed to program or that failed to erase) is greater than a certain first number N1 of failed memory cells, e.g., the program or erase is proceeding at a rate that is slower than a certain rate, e.g., a normal rate, the first voltage pulse is increased from the voltage V1 by a first program voltage step $\Delta$V2L, resulting in a second voltage pulse with a first voltage level of V2L=V1+$\Delta$V2L, as shown in FIG. 2, that is applied to the selected word line (programming) or the substrate (erasing). If the number of failed cells is less than a certain second number N2 of failed memory cells, e.g., the program or erase is proceeding at a rate that is faster than the normal rate, the first voltage pulse is increased from the voltage V1 by a second program voltage step $\Delta$V2S that is less than the first program voltage step $\Delta$V2L, resulting in a second voltage pulse with a second voltage level of V2S=V1+$\Delta$V2S that is less than the first voltage level V2L of the second voltage pulse and that is applied to the selected word line (programming) or the substrate (erasing). If the number of failed cells is between the first and second certain numbers N1 and N2, e.g., greater than or equal to the certain second number N2 and less than or equal to the certain first number N1, e.g., the program or erase is proceeding at the normal rate, the first voltage pulse is increased from the voltage V1 by a third program voltage step $\Delta$V2N that is less than the first program voltage step $\Delta$V2L and greater than the second program voltage step $\Delta$V2S, resulting in a second voltage pulse with a third voltage level of V2N=V1+$\Delta$V2N that is less than the first voltage level V2L of the second voltage pulse and greater than the second voltage level V2S of the second voltage pulse and that is applied to the selected word line (programming) or the substrate (erasing).

Note that the number of failed cells being greater than a certain first number N1 of failed memory cells, e.g., the program or erase is proceeding at a rate that is slower than the normal rate, is equivalent to the number of successfully programmed or erased cells, e.g., successful cells, being less than a certain third number N3 of successful cells so that the first voltage pulse may be increased from the voltage V1 by a first program voltage step ΔV2L when the number of successful cells is less than the certain third number N3. Similarly the number of failed cells being less than a certain second number N2 of failed memory cells, e.g., the program or erase is proceeding at a rate that is faster than the normal rate, is equivalent to the number of successful cells being greater than a certain fourth number N4 of successful cells so that the first voltage pulse is increased from the voltage V1 by a second program voltage step ΔV2S when the number of successful cells is greater than the certain fourth number N4. The number of failed cells being between the first and second certain numbers N1 and N2, e.g., greater than or equal to the certain second number N2 and less than or equal to the certain first number N1, e.g., the program or erase is proceeding at the normal rate, is equivalent to the number of successful cells being between the third and fourth certain numbers N3 and N4, e.g., greater than or equal to the certain third number N3 and less than or equal to the certain fourth number N4, so that the first voltage pulse is increased from the voltage V1 by a third program voltage step ΔV2N when the number of successful cells is greater than or equal to the certain third number N3 and less than or equal to the certain fourth number N4. For one embodiment, the first number N1, the certain second number N2, the certain third number N3, and the certain fourth number N4, are or can be different than the number of cells to be programmed for the respective programming operation or erased for the respective erase operation.

For another embodiment, if the number of failed cells is greater than the certain first number N1 (e.g., the number of successful cells is less than the certain third number N3), the time duration over which first voltage pulse is applied, e.g., the pulse width t1 of the first voltage pulse, may be increased by a first time step Δt2L, e.g., while keeping the voltage level at V1, resulting in the second voltage pulse having a first pulse width of t2L=t1+Δt2L that is applied to the selected word line or the substrate. If the number of failed cells is less than the certain second number N2 (e.g., the number of successful cells is greater than the certain fourth number N4), the pulse width t1 of the first voltage pulse, may be increased by a second time step Δt2S that is less than the first time step Δt2L, e.g., while keeping the voltage level at V1, resulting in the second voltage pulse having a second pulse width of t2S=t1+Δt2S that is less than the first pulse width t2L of the second voltage pulse and that is applied to the selected word line or the substrate.

If the number of failed cells is between the first and second certain numbers N1 and N2, e.g., greater than or equal to the certain second number N2 and less than or equal to the certain first number N1 or greater than or equal to the certain third number N3 and less than or equal to the certain fourth number N4 (e.g., the program or erase is proceeding at the normal rate) the pulse width t1 of the first voltage pulse, may be increased by a third time step Δt2N that is less than the first time step Δt2L and greater than the second time step Δt2S, e.g., while keeping the voltage level at V1, resulting in the second voltage pulse having a third pulse width of t2N=t1+Δt2N that is less than the first pulse width t2L of the second voltage pulse and greater than the second pulse width t2S of the second voltage pulse and that is applied to the selected word line or the substrate.

A verify (e.g., program or erase) voltage may be applied to the selected word line during programming or to all the word lines of the string simultaneously during an erase after applying the second voltage pulse to the selected word line or the substrate. If the number of failed cells is greater than the certain first number N1 (e.g., the number of successful cells is less than the certain third number N3), e.g., the program or erase is proceeding at a rate that is slower than the normal rate, the second voltage pulse is increased from its voltage level by a fourth program voltage step, resulting in a third voltage pulse with a first voltage level that is applied to the selected word line or the substrate. For example, as shown in FIG. 2, the second voltage pulse is increased from its second voltage level V2S by a fourth program voltage step ΔV3L, resulting in a third voltage pulse with a first voltage level V3L. For one embodiment, the second voltage pulse may be incremented from its first, second, and third voltage levels V2L, V2S, and V2N by respectively different or respectively the same values of the fourth program voltage step ΔV3L when the number of failed cells is greater than the certain first number N1 (e.g., the number of successful cells is less than the certain third number N3). Alternatively, the time duration over which second voltage pulse is applied may be increased by a fourth time step, e.g., from the pulse width t2L, t2S, or t2N, e.g., while keeping the voltage level fixed, where the fourth time step is the same or different for each pulse width.

If the number of failed cells is less than the certain second number N2 (e.g., the number of successful cells is greater than the fourth number N4), e.g., the program or erase is proceeding at a rate that is faster than the normal rate, the second voltage pulse is increased from its voltage level by a fifth program voltage step that is less than the fourth program voltage step, resulting in a third voltage pulse with a second voltage level that is less than the first voltage level of the third voltage pulse and that is applied to the selected word line or the substrate. For example, as shown in FIG. 2, the second voltage pulse is increased from its second voltage level V2S by a fifth program voltage step A V3S, resulting in a third voltage pulse with a second voltage level V3S that is less than the first voltage level V3L. Note that the second voltage pulse may be incremented from its first, second, and third voltage levels V2L, V2S, and V2N by respectively different or respectively the same values of the fifth program voltage step ΔV3S when the number of failed cells is less than the certain second number N2 (e.g., the number of successful cells is greater than the fourth number N4). Alternatively, the time duration over which second voltage pulse is applied may be increased by a fifth time step, e.g., from the pulse width t2L, t2S, or t2N, e.g., while keeping the voltage level fixed, where the fifth time step is the same or different for each pulse width and where the fifth time step is less than the fourth time step.

If the number of failed cells is between the first and second certain numbers N1 and N2, e.g., greater than or equal to the certain second number N2 and less than or equal to the certain first number N1 or greater than or equal to the certain third number N3 and less than or equal to the certain fourth number N4, e.g., the program or erase is proceeding at the normal rate, the second voltage pulse is increased from its voltage level by a sixth program voltage step that is less than the fourth program voltage step and greater than the fifth program voltage step, resulting in a third voltage pulse with a third voltage level that is less than the first voltage level of the third voltage pulse and greater than the second voltage level of the third voltage pulse and that is applied to the selected word line or the substrate. For example, as shown in FIG. 2, the second voltage pulse is increased from its second voltage level V2S by a sixth program voltage step ΔV3N, resulting in a third voltage pulse with a third voltage level V3N that is less than the first voltage level V3L and greater than the second voltage level V3S. Note that the second voltage pulse may be incremented from its first, second, and third voltage levels V2L, V2S, and V2N by respectively different or respectively the same values of the sixth program voltage step ΔV3N when the number of failed cells is greater than or equal to the certain second number N2 and less than or equal to the certain first number N1 (e.g., the number of successful cells is greater than or equal to the certain third number N3 and less than or equal to the certain fourth number N4). Alternatively, the time duration over which second voltage pulse is applied may be increased by a sixth time step, e.g., from the pulse width t2L, t2S, or t2N, e.g., while keeping the voltage level fixed, where the sixth time step is the same or different for each pulse width and where the sixth time step is less than the fourth time step and greater than the fifth time step.

The foregoing sequence of applying a voltage pulse to a selected word line (programming) or the substrate (erasing), applying a verify voltage to the selected word line or to all the word lines of the string simultaneously, and incrementing the voltage level of voltage pulse by a voltage step or the pulse width of the voltage pulse by a time step according to the number of cells that failed to program or erase (e.g., as may be based on the number of cells that successfully programmed or erased) during that voltage pulse to set the voltage level or pulse width of a subsequent voltage pulse is repeated until all of the cells are programmed or erased. For one embodiment, the amount by which a voltage level or a pulse width of voltage pulse is incremented when the number of failed cells is greater than the certain first number N1, less than the certain second number N2, or greater than or equal to the certain second number N2 and less than or equal to the certain first number N1 (e.g., when the number of successful cells is less than the certain third number N3, greater than the certain fourth number N4, or greater than or equal to the certain third number N3 and less than or equal to the certain fourth number N4) may be the same or different for each voltage pulse. For other embodiments, the certain first number N1 and/or the certain second number N2 may be the same or different for each voltage pulse. For example, the certain first number N1 and/or the certain second number N2 may depend upon the number of pulses (programming or erase) previously applied to the memory cells and may be determined from a look-up table (not shown) of control logic 116 by entering the table with the number of pulses previously applied to the memory cells. Similarly, for another embodiment, the certain third number N3 and/or the certain fourth number N4 may be the same or different for each voltage pulse. For example, the certain third number N3 and/or the certain fourth number N4 may depend upon the number of pulses (programming or erase) previously applied to the memory cells and may be determined from a look-up table by entering the table with the number of pulses previously applied to the memory cells.

Figure 3:
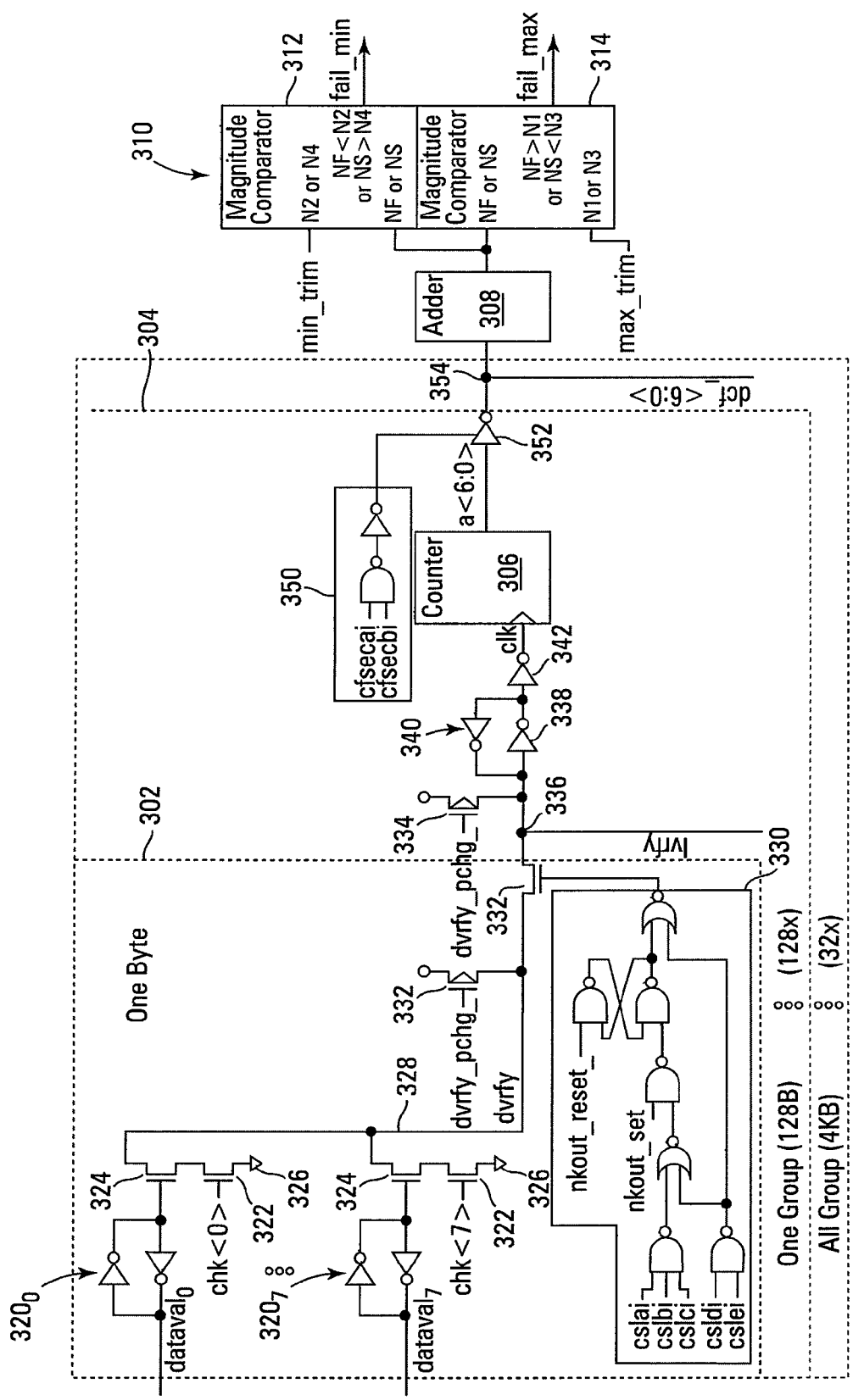
FIG. 3 illustrates a portion of an embodiment of the control logic of a memory device, according to another embodiment of the disclosure.

FIG. 3 illustrates a portion of control logic 116 of memory device 100 of FIG. 1, according to another embodiment. For one embodiment, the logic of FIG. 3 may determine a numerical value NF representative of the total number of failed memory cells during programming or erasing and whether the numerical value NF is greater than the certain first number N1, e.g., the program or erase is proceeding at a rate that is slower than the normal rate, less than the certain second number N2, e.g., the program or erase is proceeding at a rate that is faster than the normal rate, or greater than or equal to the certain second number N2 and less than or equal to the certain first number N1, e.g., the program or erase is proceeding at the normal rate. For another embodiment, the logic of FIG. 3 may determine a numerical value NS representative of the total number of successfully programmed or erased memory cells during programming or erasing and whether the numerical value NS is less than the certain first number N3, e.g., the program or erase is proceeding at a rate that is slower than the normal rate, greater than the certain fourth number N4, e.g., the program or erase is proceeding at a rate that is faster than the normal rate, or less than or equal to the certain fourth number N4 and greater than or equal to the certain third number N3, e.g., the program or erase is proceeding at the normal rate. It is noted that whether determining a numerical value NF representative of the total number of failed memory cells during programming or erasing, or a numerical value NS representative of the total number of successfully programmed or erased memory cells during programming or erasing, each numerical value is indicative of a total number of memory cells determined to be either successful or failed during verification as NF+NS equals the total number of memory cells under consideration.

For one embodiment, the logic of FIG. 3 determines the total number of failed memory cells for each page of memory array 104 (either directly or indirectly by determining the number of successful memory cells), e.g., where each may include every other memory cell of a row of memory cells of memory array 104. For example, the page may include n (e.g., 4096) bytes 302 divided into m (e.g., 32) groups 304 of l (e.g., 128) bytes 302 each, as shown in FIG. 3. There may be a counter 306 for each group 304. For example, there may be m counters for the page of memory cells. Each counter 306 determines a value (e.g., a count or inverted count) representative of the number of failed memory cells (either directly or indirectly by determining the number of successful memory cells) for its respective group 304 by counting the number of failed memory cells for its respective group 304 (either directly or indirectly by counting the number of successful memory cells) and sends the count or inverted count to an adder 308. Adder 308 determines a value NF (e.g., a sum) representative of the total number of failed memory cells or a value NS (e.g., a sum) representative of the total number of successful memory cells for each page by adding the counts or inverted counts from the respective groups 304. Adder 308 subsequently sends the value NF or NS to a comparator 310 that may include comparator portions 312 and 314, as shown in FIG. 3. For example, adder 308 may send the value NF or NS to each of comparator portions 312 and 314. For one embodiment, bytes 302 are serially coupled and serially activated, whereas the groups 304, and thus counters 306, operate in parallel.

For one embodiment, a signal min_trim representative of the certain second number N2 or the certain fourth number N4 may be applied to comparator portion 312. Comparator portion 312 compares the value NF to the certain second number N2 or the value NS to the certain fourth number N4. If the value NF, i.e., the total number of failed cells of the page, is less than the certain second number N2 or the value NS, i.e., the total number of successful cells of the page, is greater than the certain fourth number N4, comparator portion 312 outputs a signal fail_min, e.g., to a program or erase state machine (not shown) of control logic 116 (FIG. 1), having a logic level indicative of a desire to slow the rate of programming or erasing. Upon receiving the signal indicative that the value NF is less than the certain second number N2 or that the value NS is greater than the certain fourth number N4, the program or erase state machine increments the voltage level or the pulse width of the program or erase voltage pulse (e.g., the first pulse of FIG. 2) that was applied to the memory cells, as described above in conjunction with the number of failed cells being less than the certain second number N2 or the number of successful cells being greater than the certain fourth number N4.

For one embodiment, the signal fail_min becomes a logic high in response to the value NF being less than the certain second number N2 or the value NS being greater than the certain fourth number N4, thus indicating to the program or erase state machine that the program or erase is proceeding at a rate that is faster than the normal rate. Otherwise, i.e., when the value NF is greater than or equal to the certain second number N2 or the value NS is less than or equal to the certain fourth number N4, the signal fail_min stays at a logic low.

For one embodiment, a signal max_trim representative of the certain first number N1 or the certain third number N3 may be sent to comparator portion 314. Comparator portion 314 compares the value NF to the certain first number N1 or the value NS to the certain third number N3. If the value NF, i.e., the number of failed cells of the page, is greater than the certain first number N1, or the value NS, i.e., the number of successful cells of the page, is less than the certain third number N3, comparator portion 314 outputs a signal fail_max. e.g., to the program or erase state machine, having a logic level indicative of a desire to increase the rate of programming or erasing. Upon receiving the signal indicative that the value NF is greater than the certain first number N1 or that the value NS is less than the certain third number N3, the program or erase state machine increments the voltage level or the pulse width of the program or erase voltage pulse (e.g., the first pulse of FIG. 2) that was applied to the memory cells, as described above in conjunction with the number of failed cells being greater than the certain second number N1 or the number of successful cells being less than the certain third number N3.

For one embodiment, the signal fail_max becomes a logic high in response to the value NF being greater than the certain first number N1 or the value NS being less than the certain third number N3, thus indicating to the program or erase state machine that the program or erase is proceeding at a rate that is slower than the normal rate. Otherwise, i.e., when the value NF is less than or equal to the certain first number N1 or the value NS is greater than or equal to the certain third number N3, the signal fail_max stays at a logic low.

The signals fail_max and fail_min are both logic lows when the value NF is less than or equal to the certain first number N1 and greater than or equal to the certain second number N2 or when the value NS is less than or equal to the certain fourth number N4 and greater than or equal to the certain third number N3. Upon receiving fail_max and fail_min as logic lows, i.e., where the rate of programming is not indicated to be too fast or too slow, the program or erase state machine increments the voltage level or the pulse width of the program or erase voltage pulse (e.g., the first pulse of FIG. 2) that was applied to the memory cells, as described above in conjunction with the number of failed cells being greater than or equal to the certain second number N2 and less than or equal to the certain first number N1 or the number of successful cells being less than or equal to the certain fourth number N4 and greater than or equal to the certain third number N3.

For embodiments where the certain first number N1 and/or the certain second number N2 or the certain third number N3 and/or the certain fourth number N4 are different for each voltage pulse, the signal max_trim and/or the signal min_trim may be obtained from a look-up table, e.g., according to how many program or erase voltage pulse have been applied. For example, comparator portion 312 may receive the signal min_trim from a look-up table (not shown) of control logic 116 coupled to comparator portion 312 and/or comparator portion 314 may receive the signal max_trim from a look-up table (not shown) of control logic 116 coupled to comparator portion 314.

Figure 4:
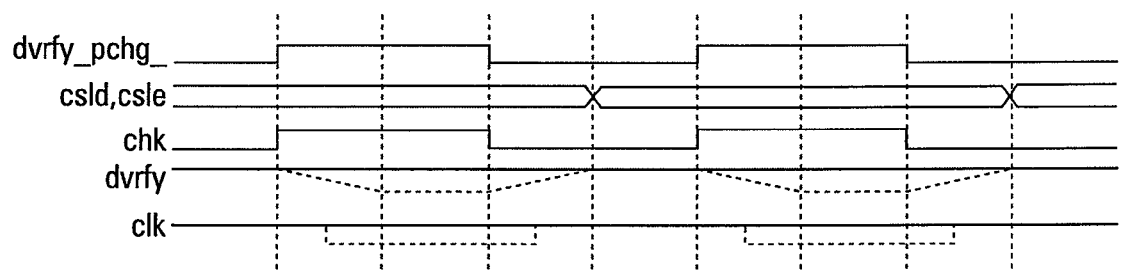
FIG. 4 presents example signal waveforms applied to various nodes of the portion of the embodiment of the control logic of FIG. 3.

For one embodiment, the logic, e.g., a sampling logic circuit, for each byte 302 includes data latches 320, e.g., cross-coupled inverters, that may form a portion of data register 120 and that are coupled for input to cache register 118 of memory device 100 (FIG. 1) for receiving data values datval therefrom, where each data latch 320 corresponds to a bit of that byte 302 and the data values datval are the data values of the memory cells respectively corresponding to the bits. The data values datval in this example are values indicative of whether a memory cell requires further programming or erasure, and not necessarily indicative of the data value of that memory cell. Note that in the example of FIG. 3, when a signal chk applied to a control gate of an n-channel field-effect transistor (nFET) 322 transitions high and a data value datval is a logic low (or logic zero) so that there is a logic high at a control gate of an nFET 324, a signal line 328 is coupled to ground 326, e.g., Vss, so that a signal dvrfy on signal line 328 transitions to a logic low, as shown by the waveforms of FIG. 4. Note that the signal chk may transition high for one bit at a time for selecting one bit at a time or for the byte by transitioning high for all of the bits of that byte for selecting the entire byte. When checking all data values in parallel, the signal dvrfy would transition low if any signal datval of that byte were low. When checking the data values serially, i.e., activating the nFETs 322 one at a time, the signal dvrfy would transition low for each signal datval of that byte that was low. Thus it can be seen that the same circuit could be used to sample each bit individually or to indicate success/failure of the byte as a whole. Also, although the example is described with reference to a byte of memory cells for convenience, the number of memory cells to be sampled by logic 302 could be any number of memory cells.

The logic for each byte 302 also includes column decoding logic 330 that receives address signals corresponding columns of memory cells. For example, when an address received at column decoding logic 330 corresponds to a column that does not include any cells that are being programmed or erased or to a column that is a known defective column, column decoding logic 330 outputs a logic low to a control gate of an nFET 332, thereby deactivating nFET 332 so that NFET 332 does not couple signal line 328 for output for byte 302. Alternatively, when an address received at column decoding logic 330 corresponds to a column that includes cells that are being programmed or erased, column decoding logic 330 outputs a logic high to the control gate of nFET 332, thereby activating nFET 332 so that nFET 332 couples signal line 328 for output for the byte 302. That is, the signal dvrfy is output for byte 302.

During operation of the logic for a byte 302, signal line 328 and node 336 are first precharged, e.g., to a supply potential Vcc, by transitioning the pre-charge signal dvrfy_pchg_ to a logic low and activating p-channel field-effect transistors (pFETs) 333 and 334. This sets the latch, i.e., cross-coupled inverters 338 and 340, such that the input to inverter 342 is a logic low. Column decoding logic 330 then activates the nFET 332 for the desired byte 302. The pre-charge signal dvrfy_pchg_ is then transitioned high and the control signals chk are transitioned high for each datval to be sampled, i.e., only one of the control signals chk<7:0> if a single bit is to be sampled or each of the control signals chk<7:0> if the byte is to be sampled in parallel. As a result, dvrfy on signal line 328 will be pulled low if any of the sampled bits is a logic low. The logic value of signal dvrfy is then latched in the cross-coupled inverters 338 and 340 for input to inverter 342. If the signal dvrfy is pulled low, the signal clk input to counter 306 will transition low, resulting in a count. This process is then repeated for the remaining bits in the byte 302, if sampling bits serially. Once the results for a byte 302 are sampled and counted, the process is repeated for each byte 302 in a group 304, such that counter 306 has determined a number of successes or failures, depending upon which value is being counted. The waveforms of this process are represented in FIG. 4.

For another embodiment, decoding logic 350 is used for addressing each counter 306. For example, each counter 306 has an address assigned thereto indicative of the memory cells corresponding to a group 304. Decoding logic 350 provides the output of a counter 306 to the adder 308 when it receives address signals indicative of the corresponding group 304 by activating tri-state inverting driver 352, for example, that is coupled to an output of the counter 306. Upon activation by decoding logic 350, the tri-state inverting driver 352 outputs an inverted count from the addressed counter 306 to a node 354 and subsequently to adder 308. In the same manner, each of the signals dcf_, e.g., containing an inverted count from the addressed counters 306, for respective ones of the remaining groups 304 of the page are directed to node 354 and subsequently to adder 308, which adds the inverted counts and sends the resulting sum to comparator portions 312 and 314.

Note that for the example of FIG. 3, the counter is incremented each time a data value datval is a logic low (which is sometimes referred to as a logic zero), meaning that the corresponding memory cell is unsuccessfully programmed or unsuccessfully erased. Therefore, for an erase operation, each inverted count that is sent from each counter 306 to adder 308 is representative of the number of erase failures for that group 304 and thus adder 308 determines the value NF representative of the total number of cells that failed to erase. Further, for a program operation, each inverted count that is sent from each counter 306 to adder 308 is representative of the number of programming successes for that group 304 and thus adder 308 determines the value NF representative of the total number of cells that failed to program. It will be appreciated by those of ordinary skill in the art that the logic of the example of FIG. 3 is not limited to this method of operation, but may be modified to determine the value NS indicative of the total number of successfully programmed and erased cells.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:

1. A method of operating a memory device, comprising:
    applying a programming voltage pulse or an erase voltage pulse to memory cells of the memory device;
    determining a rate at which programming or erasing is proceeding;
    adjusting the programming voltage pulse or the erase voltage pulse at least partially in response to the determined rate; and
    applying the adjusted programming voltage pulse or the adjusted erase voltage pulse to memory cells that failed to program or erase.

2. The method of claim 1, wherein determining the rate at which programming or erasing is proceeding comprises comparing the rate to a certain value that can be independent of a number of memory cells to be programmed or erased.

3. The method of claim 1, wherein determining the rate at which programming or erasing is proceeding comprises comparing a number indicative of the memory cells that successfully programmed or erased during the program or erase to a certain number that can be different than a number of memory cells to be programmed or erased.

4. The method of claim 3, wherein the number indicative of the memory cells that successfully programmed or erased is determined by counting the number of memory cells that successfully programmed or erased in each of two or more portions of the memory device and adding the counted number of memory cells successfully programmed or erased in each of the two or more portions together.

5. The method of claim 3, wherein the certain number depends upon a number of programming or erase voltage pulses previously applied to the memory cells in a program or erase operation.

6. The method of claim 5, wherein the certain number can be different for each of a number of applied programming voltage pulses or erase voltage pulses.

7. The method of claim 1, wherein adjusting the programming voltage pulse or the erase voltage pulse comprises at least one of adjusting a voltage level of a voltage pulse and adjusting a pulse width of the voltage pulse.

8. The method of claim 7, wherein adjusting a voltage level of the voltage pulse and/or adjusting a pulse width of the voltage pulse comprises adjusting the voltage level and/or the pulse width by a first amount when the rate at which programming or erasing is proceeding is less than a certain first rate, adjusting the voltage level and/or the pulse width by a second amount when the rate at which programming or erasing is proceeding is greater than a certain second rate, and adjusting the voltage level and/or the pulse width by a third amount when the rate at which programming or erasing is proceeding is greater than or equal to the certain first rate and less than or equal to the certain second rate.

9. The method of claim 8, wherein the first, second, and third amounts are the same.

10. The method of claim 8, wherein the first, second, and third amounts are the different than each other.

11. The method of claim 8, wherein the rate at which the programming or erasing is proceeding is less than the certain first rate when a number indicative of the memory cells that successfully programmed during the program or erase is less than a certain first number, wherein the rate at which the programming or erasing is proceeding is greater than the certain second rate when the number indicative of the memory cells that successfully programmed during the program or erase is greater than a certain second number, and wherein the rate at which the programming or erasing is proceeding is greater than or equal to the certain first rate and less than or equal to the certain second rate when the number indicative of the memory cells that successfully programmed during the program or erase is greater than or equal to the certain first number and less than or equal to the certain second number.

12. The method of claim 8, wherein the rate at which the programming or erasing is proceeding is less than the certain first rate when a number indicative of the memory cells that failed to program during the program or erase is greater than a certain first number, wherein the rate at which the programming or erasing is proceeding is greater than the certain second rate when the number indicative of the memory cells that failed to program during the program or erase is less than a certain second number, and wherein the rate at which the programming or erasing is proceeding is greater than or equal to the certain first rate and less than or equal to the certain second rate when the number indicative of the memory cells that failed to program during the program or erase is less than or equal to the certain first number and greater than or equal to the certain second number.

13. The method of claim 1, wherein determining the rate at which programming or erasing is proceeding comprises comparing a number indicative of the memory cells that failed to program during the program or erase to a certain number that can be different than a number of memory cells to be programmed or erased.

14. A memory device, comprising:
a memory array;
control logic coupled to the memory array;
wherein the control logic is configured to program and/or erase the memory cells of the memory array;
wherein the control logic is configured to determine a rate at which the program or erase is proceeding;
wherein the control logic is configured to adjust a programming voltage pulse or an erase voltage pulse at least partially in response to the determined rate; and
wherein the control logic is configured to apply the adjusted programming voltage pulse or the adjusted erase voltage pulse to memory cells that failed to program or erase.

15. The memory device of claim 14, wherein the control logic is further configured to determine the rate at which the program or erase is proceeding by comparing the rate to a certain value that can be independent of a number of memory cells to be programmed or erased.

16. The memory device of claim 14, wherein the control logic is further configured to determine the rate at which the program or erase is proceeding by comparing a number of failed bits or bytes to a certain value that is indicative of a certain rate, wherein the certain value can be different than the number of cells to be programmed or erased.

17. The memory device of claim 14, wherein the control logic is further configured to determine the rate at which programming or erasing is proceeding by comparing a number indicative of memory cells that failed to program or erase during the program or erase to a certain number that can be different than a number of memory cells to be programmed or erased.

18. The memory device of claim 14, wherein the control logic is further configured to determine the rate at which programming or erasing is proceeding by comparing a number indicative of memory cells that successfully programmed or erased during the program or erase to a certain number that can be different than a number of memory cells to be programmed or erased.

19. The memory device of claim 18, wherein the control logic is further configured to determine the number indicative of the memory cells that successfully programmed or erased by counting the number of memory cells that successfully programmed or erased in each of two or more portions of the memory device and adding the counted number of memory cells that successfully programmed or erased in each of the two or more portions together.

20. A method of programming a memory device, comprising:
applying a programming pulse to memory cells of the memory device during a programming operation;
determining a rate at which programming is proceeding;
adjusting at least one of a voltage level and a pulse width of the programming pulse at least partially in response to the determined rate; and
applying the programming pulse with the adjusted voltage level and/or pulse width to memory cells that failed to program.

21. The method of claim 20, wherein determining the rate at which programming is proceeding comprises comparing the rate to a certain value that can be independent of a number of memory cells to be programmed.

22. A method of erasing a memory device, comprising:
applying an erase pulse to memory cells of the memory device during an erase operation;
determining a rate at which erasing is proceeding;
adjusting at least one of a voltage level and a pulse width of the erase pulse at least partially in response to the determined rate; and
applying the erase pulse with the adjusted voltage level and/or pulse width to memory cells that failed to erase.

23. The method of claim 22, wherein determining the rate at which erasing is proceeding comprises comparing the rate to a certain value that can be independent of a number of memory cells to be erased.

* * * * *